United States Patent
Miyai et al.

[11] Patent Number: 5,936,711
[45] Date of Patent: Aug. 10, 1999

[54] PROJECTION EXPOSURE METHOD AND PROJECTION EXPOSURE APPARATUS

[75] Inventors: Tsuneo Miyai, Tokyo; Yuji Imai, Omiya, both of Japan

[73] Assignee: Nikon Corporation, Tokyo, Japan

[21] Appl. No.: 08/931,933

[22] Filed: Sep. 17, 1997

[30] Foreign Application Priority Data

Sep. 19, 1996 [JP] Japan .................. 8-269418

[51] Int. Cl.⁶ .......................... G03B 27/42; G03B 21/86
[52] U.S. Cl. ..................... 355/55; 355/53; 250/548; 356/401
[58] Field of Search ................. 355/53, 55; 250/548, 250/559.29, 559.31, 201.4, 201.6; 356/401, 400

[56] References Cited

U.S. PATENT DOCUMENTS

| | | | |
|---|---|---|---|
| 5,241,188 | 8/1993 | Mizutani | 250/548 |
| 5,424,552 | 6/1995 | Tsuji et al. | 250/548 |
| 5,448,332 | 9/1995 | Sakakihara et al. | 355/53 |
| 5,596,204 | 1/1997 | Irie et al. | 250/548 |
| 5,635,722 | 6/1997 | Wakamoto et al. | 250/548 |
| 5,661,548 | 8/1997 | Imai | 355/55 |

*Primary Examiner*—Alan A. Mathews
*Attorney, Agent, or Firm*—Nixon & Vanderhye P.C.

[57] ABSTRACT

A focusing operation is performed so that the center of an exposure region on a photosensitive substrate coincides with a focal point of a projection optical system, based on setting information of a variable field stop, which sets the exposure region. Even in a case where only a portion of an exposable region of the projection optical system PL is set as the exposure region using the variable field stop, and only the set portion is subjected to exposure, exposure is performed while the set exposure region is brought into accurate focus, thereby improving resolution. Accordingly, an appropriate focusing operation can be always performed so as to achieve high accuracy exposure, irrespective of variations in the shape of the exposure region.

28 Claims, 6 Drawing Sheets

PROJECTION EXPOSURE METHOD AND PROJECTION EXPOSURE APPARATUS

BACKGROUND OF THE INVENTION

The present invention relates generally to a projection exposure method and a projection exposure apparatus. In particular, the present invention relates to a projection exposure method for illuminating a mask having a pattern formed thereon with exposure light so as to expose an image of the pattern formed on the mask onto a photosensitive substrate through a projection optical system, and a projection exposure apparatus to which this exposure method is applied. The present invention is characterized in that a focusing operation is conducted at the center of an exposure region on the photosensitive substrate, irrespective of the shape of the exposure region.

A projection exposure apparatus for transferring a mask pattern onto a photosensitive substrate mounted on a stage by using exposure light such as ultraviolet light through a projection optical system has been put to practical use in various precision machining fields, for example, the manufacture semiconductor integrated circuits. This projection exposure apparatus requires a focusing system for setting the exposure shot region on the photosensitive substrate within a width corresponding to the focal depth of the imaging plane of the projection optical system, or a so-called automatic focusing system.

Such a focusing system is typically classified into (1) a direct system or (2) an indirect system. In system (1), i.e., the direct system, the focusing position of the image of the mask pattern in a reference plane provided on a stage is directly detected by using the exposure light. More specifically, as disclosed in, for example, Japanese Laid-Open Patent Publication No. 1-286418, a special mark formed on the surface of the mask pattern is projected onto the reference plane. The projected image of the mark formed on the reference plane is observed through the projection optical system and the mark so that the light quantity peak of the projected image regulated by the mark is detected, thereby discriminating the focusing position.

In system (2), i.e., the indirect system, a measuring section for measuring the height of the stage relative to the projection optical system is separately provided. The origin of the measuring section is made coincident with the focusing position, which is previously obtained using the aforementioned direct system, and the height of the exposure surface of the photosensitive substrate is detected by means of the measuring section, so that the exposure surface is guided to the focusing position indirectly. As an example of such a measuring section for measuring the stage height, for example, Japanese Laid-Open Patent Publication No. 1-41962 corresponding to U.S. Pat. No. 4,650,983 discloses a system for measuring the height of the exposure surface just below the projection optical system by using an obliquely incidence optical system fixed onto the outer side of the projection optical system.

Also, as an example, a system in which a special mark formed on the mask pattern surface is projected directly onto the exposure surface of the photosensitive substrate, and the projected image is detected through the projection optical system and the mark, thereby the focusing is directly discriminated, is disclosed in, for example, Japanese Laid-Open Patent Publication No. 57-212406.

Under such surroundings, in a case of semiconductor memory devices for which particularly high processing accuracy is required, a projection optical system with a focal depth of about 1 $\mu$m or less that uses i-ray of 365 nm in wavelength has been recently used. In this case, positioning accuracy of the focusing position of 0.1 $\mu$m or less is usually required, whereas an extremely high accuracy of 0.05 $\mu$m or less is required in another projection exposure method utilizing an interference phenomenon of the exposure light such as the one disclosed in, for example, Japanese Patent Publication 62-50811.

In recent years, an exposure process in which a plurality of chips are exposed at a time, for example, a four-chips-per-shot exposure process or a six-chips-per-shot exposure process is performed, as the exposed area is increased. In such cases, there are instances where it is desired to expose only a part of an exposable region of the projection optical system. Also, there are other instances where it is necessary to form a pattern for tests (a TEG pattern) only on a part of a wafer. In addition, there are other instances where it is desired to expose different wafers having different chip-sizes by means of the same projection exposure apparatus or where it is desired to expose a plurality kind of patterns onto different shot regions of a single photosensitive substrate, respectively, by using a reticle on which the patterns are formed. In these cases, the exposure region must be varied by performing a masking process. Therefore, a variable field stop is provided within the illuminating optical system so as to vary the shape of the exposure region.

In the conventional projection exposure apparatus, however, the focusing system (the automatic focusing system) has the detection center (detection location) only at a determined location in the exposable region (which is usually at the center of an exposable region of the projection system, i.e., on the optical axis of the projection optical system). Therefore, even in the case where only a part of the exposable region of the projection optical system is to be exposed by varying the shape of the blind for the reasons mentioned above, the focusing operation is performed at the center of the projection optical system (the projection lens). This results in exposure while the exposure region determined by the blind is not precisely in focus, thereby degrading resolution.

SUMMARY OF THE INVENTION

It is therefore an object of the present invention to provide a projection exposure method that can always effect an appropriate focusing operation so as to achieve high accuracy exposure, irrespective of variation of the shape of the exposure region.

It is another object of the present invention to provide a projection exposure apparatus that can always effect an appropriate focusing operation so as to achieve high accuracy exposure, irrespective of variation of the shape of the exposure region.

In order to achieve the above and other objects, the projection exposure method according to the invention is provided for illuminating a mask having a pattern formed thereon with exposure light so as to expose an image of the pattern formed on the mask onto a photosensitive substrate through a projection optical system. The method includes the step of performing a focusing operation for making the center of an exposure region on the photosensitive substrate coincident with a focal point of the projection optical system based on setting information of a variable field stop, which sets the exposure region prior to exposure.

According to this method, the focusing operation is performed so that the center of the exposure region coincides with the focal point of the projection optical system, based on the setting information of the variable field stop, which sets the exposure region on the photosensitive substrate. Therefore, even in a case where only a part of an exposable region of the projection optical system is determined as the exposure region using the variable field stop and only the determined exposure region is subjected to exposure, exposure can be performed while the determined exposure region is brought into focus. Accordingly, irrespective of variation of the shape of the exposure region, the focusing operation can be always performed appropriately, and high accuracy exposure can be achieved.

Various methods can be employed for precisely bringing the exposure region set by the variable field stop into focus. For example, based on the setting information of the variable field stop, after the surface of the photosensitive substrate at the center of the exposure region is brought onto a focal plane of the projection optical system at a location different from a predetermined exposure location, the photosensitive substrate may be positioned at the predetermined exposure location while keeping a position in an optical axis direction of the photosensitive substrate. This method can be achieved by adding an operation in which, prior to positioning the photosensitive substrate at the predetermined exposure location, the surface of the photosensitive substrate at the center of the exposure region set by the variable field stop is brought onto the focal plane of the projection optical system to a conventional sequence of the exposure process. This method can thus be achieved only with minor modifications to the software package.

In another arrangement, the focusing operation at the center of the exposure region set by the variable field stop is performed at a center portion of an exposable region of the projection optical system. Exposure is performed while the set exposure region is positioned at the exposure location. Thus, in some cases, an end portion of the projection optical system is used for printing. However, since the projection optical system has a component of curvature of field that is not insignificant, focusing deviation may be generated. Accordingly, it is desirable to correct the focusing deviation due to the component of curvature of field when performing the focusing operation at the center of the exposure region.

In view of this, according to the present invention, a projection exposure method for illuminating a mask having a pattern formed thereon with exposure light so as to expose an image of the pattern formed on the mask onto a photosensitive substrate through a projection optical system, includes a first step of performing a measurement of curvature of field of the projection optical system; and a second step of performing a focusing operation at a center of an exposure region on the photosensitive substrate based on data on the curvature of field obtained in the first step and setting information of a variable field stop, which sets a shape of the exposure region.

According to this method, in the second step, the focusing operation is performed at the center of the exposure region on the photosensitive substrate based on the data on the curvature of field obtained in the first step and the setting information of the variable field stop, which sets the exposure region. Therefore, an optimum focusing operation in which the focusing deviation due to the effect of the component of curvature of field is corrected can be performed.

For example, the measurement in the first step may be performed previously, and the operation in the second step may be performed by using this measurement result when performing the exposure. Alternatively, the operations in the first and second steps may be performed when performing the exposure, prior to starting the exposure.

It is desirable to perform the measurement in the first step with respect to at least three locations on the photosensitive substrate. In a case where the number of measuring locations at which the measurement of the curvature of field is performed is small, the data on the curvature of field obtained in the first step may be interpolated using a quadratic function to a sixth-order function, and then, in the second step, the focusing operation may be performed at the center of the exposure region based on the interpolated data on the curvature of field and the setting information of the variable field stop. In this case, the data on curvature of field of the projection optical system can be obtained precisely without spending much time for the measurement in the first step. Therefore, the focusing operation considering the focusing deviation due to the effect of the curvature of field can be realized when the exposure is performed by using any portion of the projection optical system.

According to another aspect of the present invention, a projection exposure apparatus for illuminating a mask having a pattern formed thereon with exposure light so as to expose an image of the pattern formed on the mask onto a photosensitive substrate through a projection optical system is provided. The projection exposure apparatus includes a specimen support, which is movable in at least three axial directions while holding the photosensitive substrate, the three axial directions including an optical axis direction of the projection optical system and mutually orthogonal two axial directions in a plane perpendicular to the optical axis direction; a position control system for controlling at least positions in the three axial directions of the specimen support; a focal point detection system for detecting a position in the optical axis direction of the photosensitive substrate in the vicinity of an optical axis of the projection optical system; a variable field stop for setting an exposure region on the photosensitive substrate where the image of the pattern is projected; and a controller for discriminating the exposure region on the photosensitive substrate based on the setting information of the variable field stop, and for moving the exposure region on the photosensitive substrate to a predetermined exposure location after an approximate center of the exposure region is brought onto a focal point of the projection optical system by using the position control system and the focal point detection system.

According to this aspect of the invention, the specimen support is movable in at least three axial directions including the optical axis direction of the projection optical system and mutually orthogonal two axial directions in a plane perpendicular to the optical axis direction while holding the photosensitive substrate, and positions in the three axial directions of the specimen support are controlled by the position control system. Moreover, the focal point detection system detects a position in the optical axis direction of the photosensitive substrate in the vicinity of the optical axis of the projection optical system.

In this case, when the exposure region on the photosensitive substrate where the image of the pattern formed on the mask is projected is set by the variable field stop, the controller discriminates the exposure region on the photosensitive substrate based on the setting information of the variable field stop, and the controller moves the exposure region on the photosensitive substrate to a predetermined exposure location after an approximate center of the exposure region is brought onto the focal point of the projection optical system using the position control system and the focal point detection system. Therefore, even in a case where only a portion of an exposable region of the projection optical system is set as the exposure region using the variable field stop and only the set region is subjected to exposure, exposure can be performed while the set exposure region is brought into focus, thereby improving resolution. Accordingly, irrespective of variation of the shape of the exposure region, an appropriate focusing operation can be always performed so as to achieve high accuracy exposure.

According to still another aspect of the present invention, a projection exposure apparatus for illuminating a mask having a pattern formed thereon with exposure light so as to expose an image of the pattern formed on the mask onto a photosensitive substrate through a projection optical system is provided. The projection exposure apparatus includes a specimen support that is movable in at least three axial directions while holding the photosensitive substrate, the three axial directions including an optical axis direction of the projection optical system and mutually orthogonal two axial directions in a plane perpendicular to the optical axis direction; a position control system for controlling at least positions in the three axial directions of the specimen support; a focal point detection system for detecting a position in the optical axis direction of the photosensitive substrate in the vicinity of an optical axis of the projection optical system; a variable field stop for setting an exposure region on the photosensitive substrate where the image of the pattern is projected; a memory for storing data on curvature of field of the projection optical system measured with respect to at least three locations on the photosensitive substrate; an operator for calculating a difference between a focusing position in the exposure region of the projection optical system and a focusing position in the vicinity of the optical axis of the projection optical system, based on the data on curvature of field; and a controller for positioning the photosensitive substrate via the position control system so that an approximate center of the exposure region coincides with a detection center of the focal point detection system based on setting information of the variable field stop, and for performing a focusing operation of the exposure region using the obtained difference.

According to this arrangement, the memory stores the data on the curvature of field of the projection optical system measured for at least three locations on the photosensitive substrate.

In this case, when the exposure region on the photosensitive substrate where the image of the pattern formed on the mask is projected is set by the variable field stop, the operator calculates a difference between a focusing position in the exposure region of the projection optical system and a focusing position in the vicinity of the optical axis of the projection optical system based on the data on the curvature of field stored in the memory. Then, the controller positions the photosensitive substrate via the position control system so that an approximate center of the exposure region coincides with a detection center of the focal point detection system, based on the setting information of the variable field stop, and performs the focusing operation of the exposure region by means of the focal point detection system using the difference.

Thus, even in a case where only a portion of the exposable region of the projection optical system is set as the exposure region by the variable field stop and only the set exposure region is subjected to exposure, exposure can be performed while the set exposure region is brought into focus. Also, since the controller performs a focusing operation at the center of the exposure region based on the data on the curvature of field and the setting information of the variable field stop, which sets the exposure region on the photosensitive substrate, an optimum focusing operation in which the focusing deviation due to the curvature of field is corrected can be achieved. Accordingly, irrespective of exposure region shape variation, a higher accuracy focusing operation can be achieved.

In this way, the focusing deviation due to the effect of the curvature of field can be corrected using the data on the curvature of field, which has been previously measured and stored in the memory, when performing the focusing operation. The curvature of field, however, may also be measured when performing the exposure.

In view of this, according to yet another aspect of the present invention, a projection exposure apparatus for illuminating a mask having a pattern formed thereon with exposure light so as to expose an image of the pattern formed on the mask onto a photosensitive substrate through a projection optical system is provided. The projection exposure apparatus includes a substrate stage that is movable two-dimensionally in a reference plane; a specimen support that is mounted on the substrate stage and movable in an optical axis direction of the projection optical system while holding the photosensitive substrate; a driving system for driving the substrate stage and the specimen support in respective moving directions; a position measuring section for measuring a position in the reference plane of the specimen support; a stage control system for controlling a position of the substrate stage, while monitoring an output of the position measuring section; a focal point detection system for detecting a position in the optical axis direction of the photosensitive substrate in the vicinity of an optical axis of the projection optical system; a variable field stop for setting an exposure region on the photosensitive substrate where the image of the pattern is projected; a second focal point detection system for discriminating an optimum imaging plane of the projection optical system; a curvature of field measuring section for measuring data on curvature of field of the projection optical system at a plurality of locations within the exposure region set by the variable field stop, using the second focal point detection system, based on setting information of the variable field stop; an operator for calculating a difference between a focusing position within the exposure region and a focusing position of the projection optical system in the vicinity of a detection center of the focal point detection system, based on the data on curvature of field; a controller for positioning the photosensitive substrate via the stage control system so that a center of the exposure region set by the variable field stop coincides with the detection center of the focal point detection system, based on the setting information of the variable field stop, and for adjusting the focal point detection system using the difference to perform a focusing operation.

According to this aspect of the invention, the substrate stage is movable two-dimensionally in the reference plane, and on the substrate stage is mounted the specimen support, which is movable in the optical axis direction of the projection optical system while holding the photosensitive substrate. Therefore, the specimen support can be accurately moved two-dimensionally in the reference plane and in the optical axis direction of the projection optical system. The driving system drives the substrate stage and the specimen support in the respective moving directions. The position in the reference plane of the specimen support is measured by the position measuring section. While monitoring the output of the position measuring section, the stage control system controls the position of the substrate stage via the driving system. Moreover, the focal point detection system detects the position in the optical axis direction of the photosensitive substrate in the vicinity of the optical axis of the projection optical system. Furthermore, the second focal point detection system is provided for discriminating the optimum imaging plane of the projection optical system. In addition, the variable field stop is provided for setting the exposure region on the photosensitive substrate where the image of the pattern of the mask is projected.

In this case, when the curvature of field measuring section measures data on curvature of field of the projection optical system at a plurality of locations within the exposure region set by the variable field stop using the second focal point detection system, based on the setting information of the variable field stop, the operator calculates a difference between a focusing position in the exposure region and a focusing position of the projection optical system in the vicinity of the detection center of the focal point detection system. Then, the controller positions the photosensitive substrate via the stage control system based on the setting information of the variable field stop so that the center of the exposure region set by the variable field stop coincides with the detection center of the focal point detection system, and the controller adjusts the focal point detection system using the calculated difference so as to perform the focusing operation.

BRIEF DESCRIPTION OF THE DRAWINGS

These and other aspects and advantages of the present invention will be described in detail with reference to the accompanying drawings, in which:

FIG. 4A shows the signal level when a light emitting mark is reverse-projected onto a chromium portion of a pattern surface of a reticle, and FIG. 4B shows the signal level when the light emitting mark is reverse-projected onto a glass portion (transparent portion) of the pattern surface;

FIG. 6A shows a waveform of the calibration signal, and FIG. 6B shows a waveform of the focusing position detection signal;

DETAILED DESCRIPTION OF PREFERRED EMBODIMENTS

With reference to FIGS. 1 to 8, a preferred embodiment of the present invention will be explained below.

Figure 1:
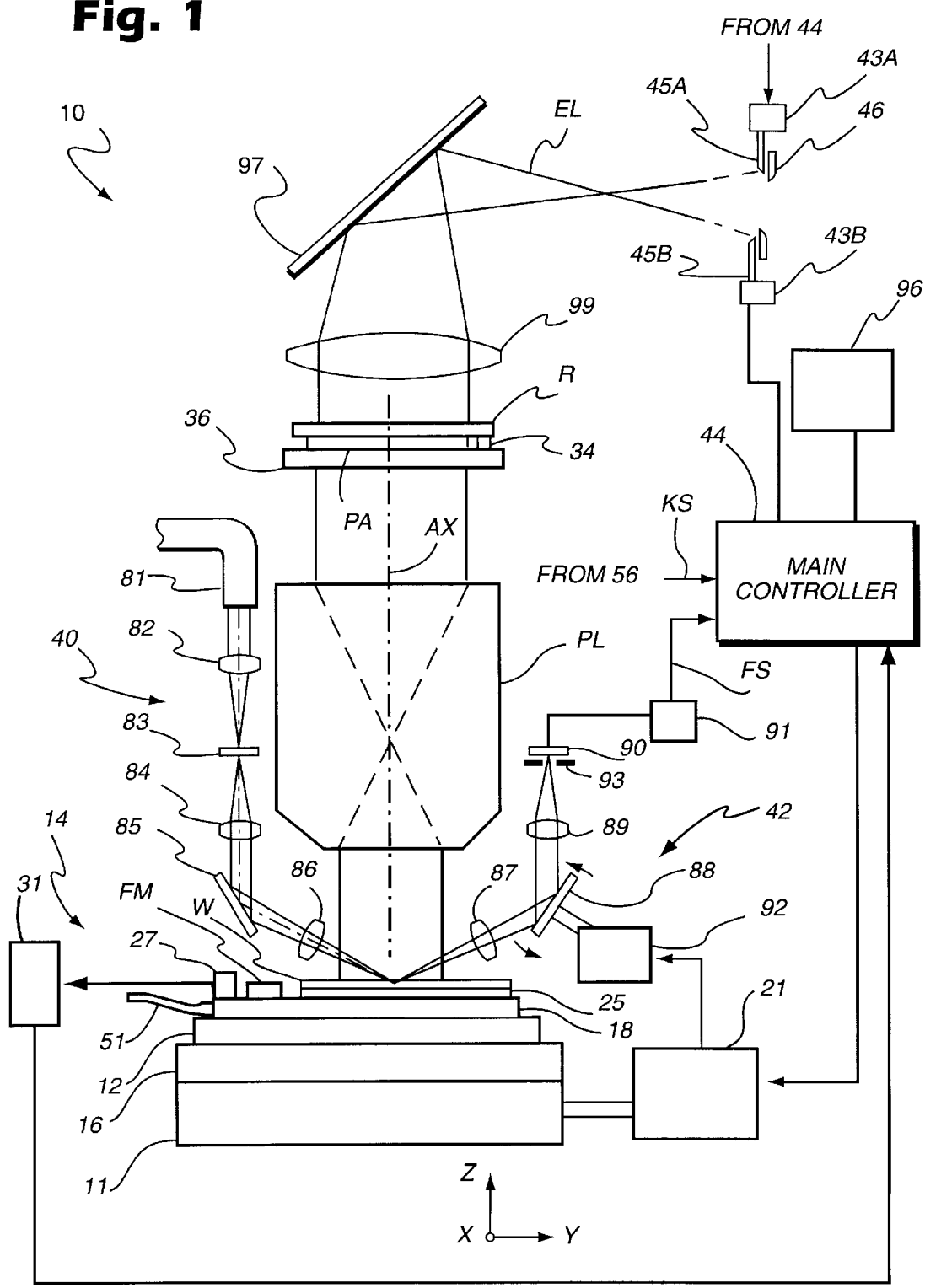
FIG. 1 is a diagram schematically showing a structure of a projection exposure apparatus according to an embodiment of the present invention.

FIG. 1 schematically shows a projection exposure apparatus 10 according to an embodiment of the present invention. The projection exposure apparatus 10 is a so-called reducing projection exposure apparatus employing a step and repeat system.

The projection exposure apparatus 10 includes an X-Y stage device 14 having a substrate table 18 as a specimen support, which is movable in mutually orthogonal three axial directions containing two orthogonal axial directions X and Y in a reference plane (an X-Y plane) and a Z-axis direction perpendicular to the reference plane. A projection optical system PL is disposed above the X-Y stage device 14 with an optical axis AX thereof parallel to the Z-axis direction and perpendicular to the reference plane. A reticle holder 36 for holding a reticle R is disposed perpendicularly to the optical axis AX of the projection optical system PL above the projection optical system PL.

The X-Y stage device 14 includes a base 11, a Y-stage 16, which can reciprocate in the Y direction as shown in FIG. 1 on the base 11, an X-stage 12, which can reciprocate in the X direction perpendicular to the Y direction on the Y stage 16, and the substrate table 18 provided on the X-stage 12. A wafer holder 25 is mounted on the substrate table 18 and holds a wafer W by vacuum suction.

The substrate table 18 is set up on the X stage 12 and is positioned in the X and Y directions and is allowed to move in the Z direction and to rotate around the Z direction (by rotation θ). A movable mirror 27 is fixed onto the substrate table 18, and an interferometer 31 arranged externally as a position measuring section monitors a position of the substrate table 18 in the X direction, in the Y direction and in the θ direction with high accuracy (with a resolution of 0.01 μm, for example). The positional information obtained by the interferometer 31 is supplied to a main controller 44, which controls the positioning of the Y-stage 16, the X-stage 12 and the substrate table 18 via a driving device 21 or the like as a driving system, and integrally controls operations of the projection exposure apparatus. The driving device 21 drives the substrate table 18 in the Z direction and rotates the substrate table 18 in the θ direction via a Zθ driving system (not shown).

A reference mark plate FM is fixed onto one end portion of the substrate table 18. The reference mark plate FM has various reference marks formed thereon for, for example, a base line measurement, which is a distance from the detection center of an off-axis type alignment detection system (not shown) to the optical axis of the projection optical system PL. The marks on the reference mark plate FM contain a reference pattern used for discriminating the optimum imaging plane of the projection optical system PL. A structure of a second focal point detection system that discriminates the optimum imaging plane of the projection optical system and the like will be described in detail below.

The reticle holder 36 has vacuum suction portions 34 at the four corners thereof. By means of the vacuum suction portions 34, the reticle R is held on the reticle holder 36. The reticle holder 36 has an opening (which is omitted in FIG. 1) corresponding to a pattern region PA of the reticle R, which is a region where a circuit pattern is formed, and can be moved precisely in the X and Y directions and in the θ direction by a driving section (not shown), thereby allowing the reticle R to be positioned such that the center of the pattern region PA (the reticle center) is on the optical axis AX of the projection optical system PL.

In the projection exposure apparatus 10, alignment with the reticle R and the wafer W is performed by the main controller 44 based on a detection signal of the alignment detection system (not shown). Also, adjustment of the plane position is performed by controlling the substrate table 18 to be driven in the Z axis direction by the main controller 44 via the driving device 21 so that the pattern plane of the reticle R is conjugate with the surface of the wafer W with respect to the projection optical system PL and that the focusing plane of the projection optical system PL coincides with the surface of the wafer W. Where the positioning and the focusing are performed, when the pattern region PA of the reticle R is illuminated by exposure light EL exiting from an illumination optical system including a mirror 97 and a main condenser lens 99 with substantially uniform illumination, a reduced image of the pattern of the reticle R is imaged by the projection optical system PL on the wafer W. The wafer W is provided with photoresist on its surface.

Although detailed structure of the illumination optical system is not shown in FIG. 1, the illumination optical system may include a light source such as a mercury vapor lamp, an elliptic mirror that converges the exposure light emitted by the light source, an input lens that converts the converged exposure light into a bundle of substantially collimated light beams, a fly-eye lens on which the light beams output from the input lens are incident so as to form a number of secondary light sources on a rear (reticle-side) focal plane thereof, and a condenser lens system that converges the exposure light exiting from the secondary light sources to illuminate the reticle R with uniform illumination, and the like. Moreover, in the present embodiment, a movable blind serving as a variable field stop and having two L-shaped movable blades 45A and 45B is provided in the illumination optical system (hereinafter, the movable blind is referred to as movable blinds 45A and 45B). A plane on which the movable blinds 45A and 45B are disposed is conjugate to a plane of the pattern of the reticle R. A fixed blind 46 is arranged in the vicinity of the movable blinds 45A and 45B, which has an opening having a fixed shape. The fixed blind 46 is a field stop composed of, for example, four knife edges surrounding a rectangular opening. The rectangular opening defines an exposable region SA (see FIG. 7), which can be exposed by the projection optical system.

The movable blinds 45A and 45B are driven in the X and Z directions within the X-Z plane by movable blind driving sections 43A and 43B, thereby masking a part of the exposable region SA on the reticle R, which is defined by the fixed blind 46, so as to set the shape of the illuminated region to be an arbitrary rectangular shape and size. As a result, the exposure region on the wafer W, which is conjugate to the illuminated region on the reticle R, is set to have a corresponding arbitrary rectangular shape and size. That is, in the present embodiment, the movable blinds 45A and 45B set the exposure region sa (see FIG. 7) on the wafer W. The operations of the driving sections 43A and 43B are controlled by the main controller 44 in accordance with blind setting information (masking information) from a main computer (not shown).

In the present embodiment, a focal point detection system on which light is obliquely incident is provided to detect a position of the surface of the wafer W in the Z direction (the optical axis AX direction) when the wafer W is located in a region onto which the pattern is projected by the projection optical system PL. The focal point detection system includes an illumination optical system 40 constituted by a bundle of optical fibers 81, a condenser lens 82, a slit plate 83, a lens 84, a mirror 85 and an illumination objective lens 86; and a light receiving optical system 42 constituted by a condenser objective lens 87, a rotational direction vibration plate 88, an imaging lens 89, a light receiving slit plate 93 and a photosensor 90 such as a silicon photodiode or a phototransistor.

The action of the respective constituents of the focal point detection system will be described. Illumination light having a wavelength that is different from that of the exposure light EL and to which the photoresist on the wafer W is not sensitive is directed from an illumination light source (not shown) through the optical fiber bundle 81. The illumination light exiting from the optical fiber bundle 81 passes through the condenser lens 82 and illuminates the slit plate 83. After being transmitted by a slit (an opening) of the slit plate 83, the illumination light illuminates the wafer W obliquely through the lens 84, the mirror 85 and the illumination objective lens 86. At this time, an image of the slit of the slit plate 83 is imaged on the surface of the wafer W by the lens 84 and the illumination objective lens 86 when the surface of the wafer W is located on the optimum imaging plane. An angle between an optical axis of the objective lens 86 and the surface of the wafer is set in a range of about 5 degrees to about 12 degrees. In addition, the image of the slit of the slit plate 83 has its center at a point at which the optical axis AX of the projection optical system PL crosses the wafer W.

The light bundle with the image of the slit that is reflected by the wafer W passes through the condenser objective lens 87, the rotational direction vibration plate 88 and the imaging lens 89, and is imaged again on the light receiving slit plate 93 disposed upstream of the photosensor 90. The rotational direction vibration plate 88 has a function of making the image of the slit formed on the light receiving slit plate 93 vibrate in a direction perpendicular to a longitudinal direction thereof. A plane-parallel plate for shifting a relative relationship between the slit of the light receiving slit plate 93 and the vibration center of the slit image reflected by the wafer W toward a direction perpendicular to the longitudinal direction of the slit may be provided between the imaging lens 89 and the light receiving slit plate 93.

The main controller 44 has an oscillator (OSC) therein. A vibration exciter 92 driven by a driving signal from the OSC makes the rotational direction vibration plate 88 vibrate.

When the slit image vibrates on the light receiving slit plate 93, the light bundle transmitted by the slit of the slit plate 93 is received by the photosensor 90. A detection signal (a photoelectric converted signal) from the photosensor 90 is supplied to a signal processor 91. The signal processor 91 has a phase detection circuit (PSD) to which an alternating signal having the same phase as that of the driving signal from the OSC is input. The signal processor 91 performs synchronous commutation using the phase of the above alternating signal as a reference so as to output a detection output signal, i.e., a focusing position detection signal FS to the main controller 44. The focusing position detection signal FS, referred to as a so-called sigmoid curve signal, becomes a zero level when the center of the slit of the light receiving slit plate 93 coincides with the vibration center of the slit image reflected by the wafer W, a positive level when the wafer W deviates upwardly from the zero-level position, and a negative level when the wafer W deviates downwardly from the zero-level position. Therefore, a position in the height direction (a position in the optical axis direction) of the wafer W when the focusing position detection signal FS becomes the zero level is discriminated as the focusing position.

In such an oblique incidence detection system, however, it is not assured that the height of the wafer W discriminated as the focusing position always coincides with the optimum imaging plane. The focusing position detection signal FS is a signal indicative of a position of the reference mark plate FM or the wafer W in the optical axis direction of the projection optical system PL, that is, a signal indicating the focusing position indirectly. Therefore, in order to detect the focusing position using the focusing position detection signal FS, focusing states of the reference mark plate FM or the wafer W with respect to the projection optical system PL are directly examined in advance, and offset adjustment (calibration of the focal point detection system (40, 42)) is performed so that the level of the focusing position detection signal FS becomes a predetermined level (referred to as a "pseudo-focusing level") at or in the vicinity of an actual focusing position, and thereafter the movement of the substrate table 18 in the Z-axis direction is controlled so that the signal FS becomes the pseudo-focusing level. As the pseudo-focusing level, for example, zero can be used.

In such a case, there are optical and electrical techniques for performing the calibration of the focal point detection system (40, 42) by setting a predetermined offset in the level of the focusing position detection signal FS at the focusing position or the like. The optical setting can be obtained mainly by varying the distribution of the light quantity on the light receiving surface of the photosensor 90 to a predetermined location, while the reference mark plate FM or the like is located at a predetermined position in the Z-axis direction. For example, when a plane-parallel plate is disposed before the photosensor 90, as described above, and an angle at which the plane-parallel plate is disposed is varied, the light quantity distribution on the light receiving surface of the photosensor 90 is also varied, and thereby the calibration can be performed. Alternatively, the offset can be electrically added to the signal FS so that the level of the signal FS reaches the focusing level.

As described above, since the focusing position detection signal FS is a signal indicating the focusing position indirectly, there is a possibility of deviation between the focusing position at which the signal FS becomes the pseudo-focusing level and the actual focusing level, in a case where a position of the imaging plane (the focal plane) of the projection optical system PL is varied due to absorption of the exposure light or the like. Therefore, in the present embodiment, offset setting of the focusing position detection signal FS (calibration of the focal point detection system (40, 42)) is performed using a calibration signal KS. For this reason, in the present embodiment, a second focal point detection system, which discriminates the optimum imaging plane of the projection optical system PL so as to output the calibration signal KS to the main controller 44, is provided.

Figure 2:
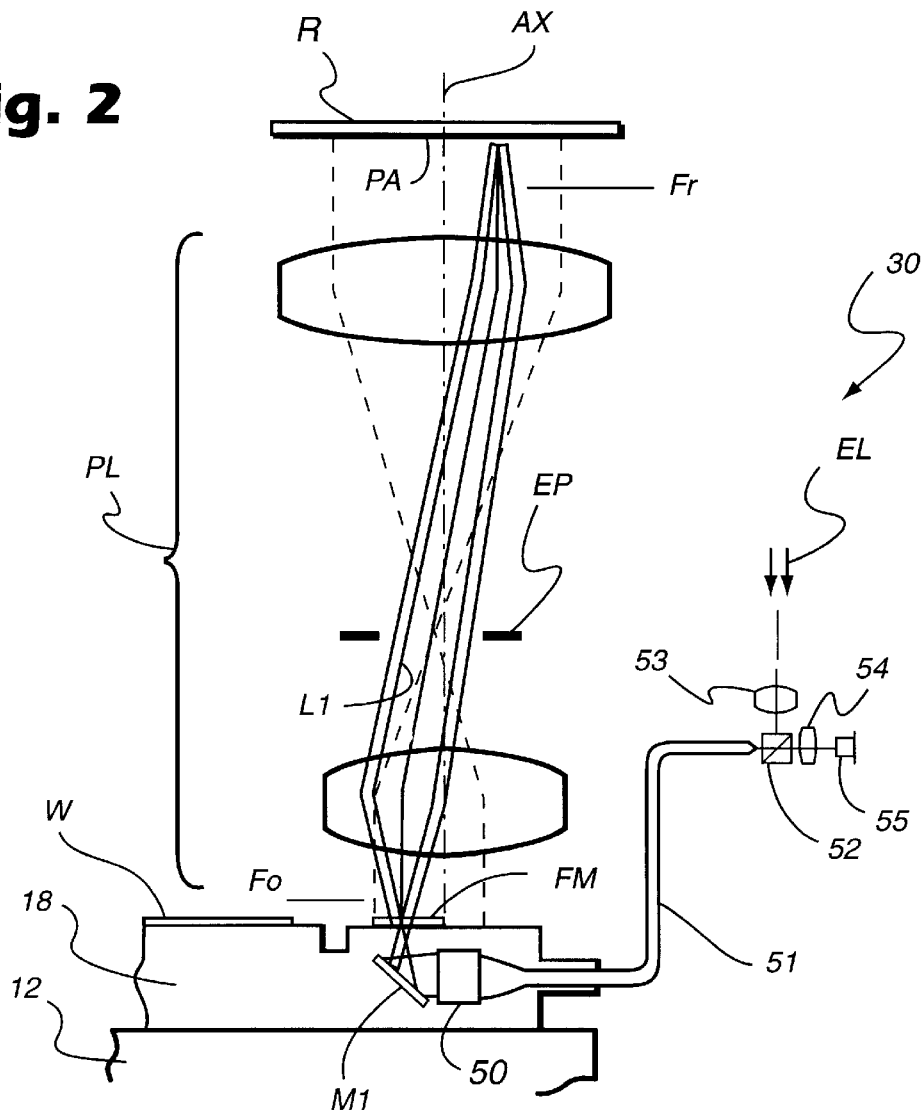
FIG. 2 is a diagram showing a structure of a second focal point detection system of TTL type that detects the best focusing plane of a projection optical system included in the projection exposure apparatus shown in FIG. 1.

With reference to FIG. 2, the second detection system 30 for discriminating the optimum imaging plane of the projection optical system PL will be explained.

FIG. 2 illustrates a structure of a TTL type second focal point detection system 30, which discriminates the optimum focusing plane of the projection optical system PL of the projection exposure apparatus 10.

The second focal point detection system 30 includes the reference mark plate FM (more strictly, the reference pattern on the reference mark plate FM) fixed onto the substrate table 18 at a position in the height direction that is substantially the same as that of the surface of the wafer W, a mirror M1 provided below the reference mark plate FM (in the inside of the substrate table 18), an illumination objective lens 50, an optical fiber 51, a beam splitter 52 provided on the incidence-side of the optical fiber 51, lens systems 53 and 54 and a photoelectric sensor 55.

In FIG. 2, the optical axis AX of the projection optical system PL, which is divided into front and rear groups by a field stop plane (a pupil plane), passes through the center of the reticle R, i.e., the center of the pattern region PA such that the optical axis AX is perpendicular to the reticle pattern surface.

Figure 3:
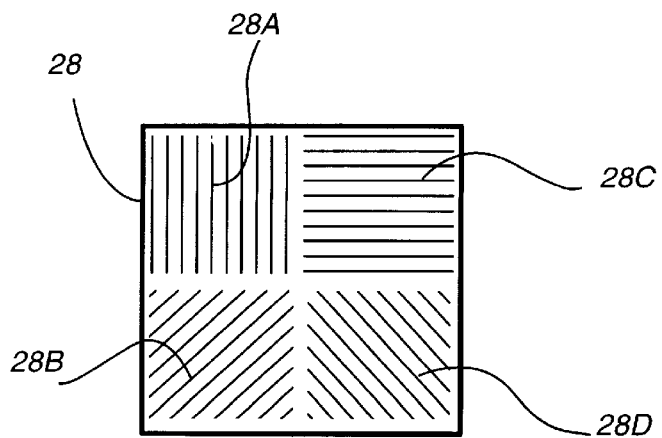
FIG. 3 shows diffraction grating marks formed on a reference mark plate FM shown in FIG. 1.

As shown in FIG. 3, an amplitude type diffraction grating mark 28A having lines and spaces with a constant pitch and diffraction grating marks 28B, 28C and 28D that are obtained by rotating the diffraction grating mark 28A in counterclockwise direction by 45°, 90° and 135°, respectively, are formed on the upper surface of the reference mark plate FM. These four diffraction grating marks 28A to 28D constitute the reference pattern 28. The purpose of forming the diffraction grating marks having various orientations is to remove the effect of the pattern on the reticle R and to enable focusing positions (astigmatism) in a sagittal (S) direction and a meridional (M) direction at a location within an image field of the projection optical system PL to be measured. The surface of the reference mark plate FM on which the diffraction grating marks are formed is set at the same height in the optical axis direction of the projection optical system PL as that of the exposure surface of the wafer W. It should be noted that the pattern formed on the reference mark plate FM may be a phase type diffraction grating mark.

Returning to FIG. 2, illumination light for exposure EL is directed into the optical fiber 51 through the lens system 53 and the beam splitter 52 arranged on the incidence-side of the optical fiber 51. The illumination light exits from the outgoing end of the optical fiber 51 and is converged by the objective lens 50 so as to illuminate the diffraction grating marks 28A to 28D on the reference mark plate FM from the back side thereof through the mirror M1. Although it is desirable that the illumination light EL is obtained by a light source for illuminating the reticle R (a mercury vapor lamp, an excimer laser or the like), a light source for exclusive use may be provided separately. In the latter case, it is necessary for the separately provided light source to have a wavelength that is the same as or very close to the wavelength of the illumination light for exposure.

Moreover, it is desirable that an illumination condition of the reference mark plate FM by the objective lens 50 is made coincident with an illumination condition by the projection optical system PL during the pattern projection. In other words, it is desirable that numerical aperture (N.A.) of the illumination light on the image-side of the projection optical system PL is made substantially coincident with a numerical aperture (N.A.) of the illumination light to the reference mark plate FM from the objective lens 50.

Image light beams are generated at the diffraction grating marks 28A to 28D on the reference mark plate FM illuminated by the illumination light EL, which are supplied to the projection optical system PL. In FIG. 2, the substrate table 18 is assumed to be set such that the reference mark plate FM is located slightly below the optimum imaging plane Fo of the projection optical system PL (the conjugate plane to the reticle). The image light beams L1 generated from a point on the reference mark plate FM pass through the center of the pupil plane EP of the projection optical system PL, diverge after being converged in a plane Fr, which is located slightly below the pattern surface of the reticle R, and return along the same optical path after being reflected by the pattern surface of the reticle R. It is noted that the plane Fr is disposed such that the plane Fr and the reference mark plate FM are in conjugate relations with respect to the projection optical system PL. In a case where the projection optical system PL is a double-telecentric system, the image light beams from the diffraction grating marks (light emitting marks) 28A to 28D on the reference mark plate FM are regularly reflected by the lower surface of the reticle R (the pattern surface) and then return so as to superimpose the diffraction grating marks (light emitting marks) 28A to 28D. However, when the reference mark plate FM deviates from the imaging plane Fo, as shown in FIG. 2, reflected images of the marks 28A to 28D formed on the reference mark plate FM get blurred. On the other hand, when the reference mark plate FM coincides with the imaging plane Fo, the imaging plane Fo also coincides with the pattern surface of the reticle R and therefore the reflected images of the marks 28A to 28D formed on the reference mark plate FM become sharp while being superimposed on the marks, respectively. In the projection optical system PL, which is a double-telecentric system, the reflected images of the light emitting marks 28A to 28D that are reflected by the pattern surface of the reticle R are projected onto the light emitting marks 28A to 28D. When the reference mark plate FM is defocused, the reflected images become larger than the sizes of the marks 28A to 28D, and illumination per unit area is reduced.

Thus, light beams of portions of the reflected images formed on the reference mark plate FM, which are not blocked by the marks 28A to 28D, are received by the optical fiber 51 through the mirror M1 and the objective lens 50, and are also received by the photoelectric sensor 55 through the beam splitter 52 and the lens system 54. The light receiving surface of the photoelectric sensor 55 is disposed substantially conjugate to the pupil plane EP (Fourier transformation plane) of the projection optical system PL.

In the structure shown in FIG. 2, a contrast signal can be obtained only by moving the substrate table 18 in upward and downward directions (the Z direction).

Figure 4A:
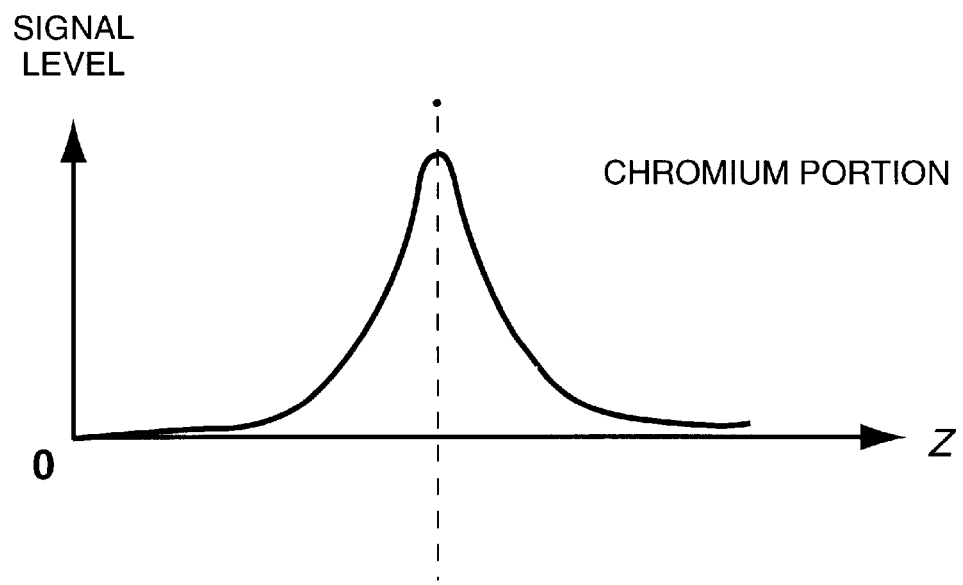
FIGS. 4A and 4B show signal level characteristics of a calibration signal, where
Figure 4B:
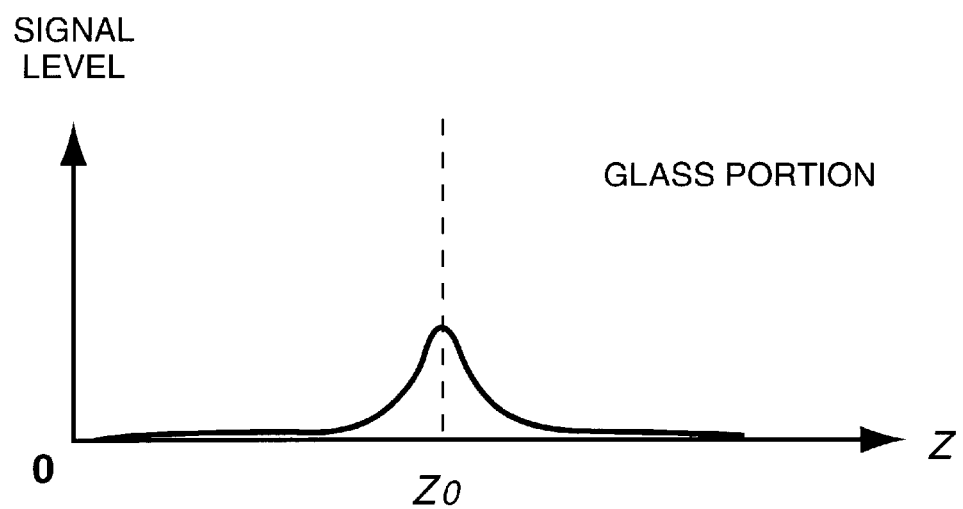

FIGS. 4A and 4B show signal level characteristics of an output signal of the photoelectric sensor 55, i.e., a calibration signal KS. In both of FIGS. 4A and 4B, a horizontal axis represents a position in the Z direction of the substrate table 18, i.e., a position of the reference mark plate FM in the optical axis AX direction. FIG. 4A shows the signal level when the light emitting marks 28A to 28D are reverse-projected onto a chromium portion of the pattern surface of the reticle R, while FIG. 4B shows the signal level when the light emitting marks 28A to 28D are reverse-projected onto a glass portion (a transparent portion) of the pattern surface. Typically, the chromium portion of the reticle is deposited on a glass (quartz) plate to have a thickness of about 0.3 to 0.5 $\mu$m. The reflectance of the chromium portion is remarkably larger than that of the glass portion. However, the reflectance of the glass portion is not completely zero. Thus, the signal can be detected although the level thereof is considerably small, as shown in FIG. 4B. Moreover, in general, a reticle for producing an actually-used device has a large pattern density. Therefore, the possibility that all of the reverse-projected images of the light emitting marks 28A to 28D overlap the glass portion (transparent portion) of the reticle pattern at the same time is considerably low.

In any case, when the surface of the reference mark plate FM is moved in the optical axis direction so as to travel across the optimum imaging plane Fo, the signal level becomes maximum at a position Zo in the Z direction. Therefore, a position of the optimum imaging plane Fo can be obtained by measuring both a position of the substrate table 18 in the Z direction and the output signal KS and by detecting a position of the substrate table 18 in the Z direction when the signal level becomes maximum. Also, this detection method allows the imaging plane Fo to be discriminated at an arbitrary location on the reticle R. That is, an absolute focusing position (the optimum imaging plane Fo) can be measured at an arbitrary location in the projection field (image field), as long as the reticle R is set on the object-side of the projection optical system PL. In addition, the thickness of the chromium portion of the reticle R is 0.3 to 0.5 $\mu$m, as described above, and a detection error of the optimum imaging plane Fo due to the thickness of the chromium portion is obtained to be $(0.3 \text{ to } 0.5) \times (\frac{1}{5})^2 = 0.012$ to 0.02 $\mu$m when the reduction projection magnification of the projection optical system PL is assumed to be, for example, $\frac{1}{5}$ times. This detection error is of a negligible amount.

Next, with reference to FIG. 5, an example of the operation of the projection exposure apparatus 10 according to the present invention in a case where calibration of the focusing position detection signal FS is performed will be described. In this case, it is assumed that a position at which a Z-axis coordinate of the substrate table 18 designated as $Z_B$ is set to be the focusing position by previous calibration or the like.

Figure 5:
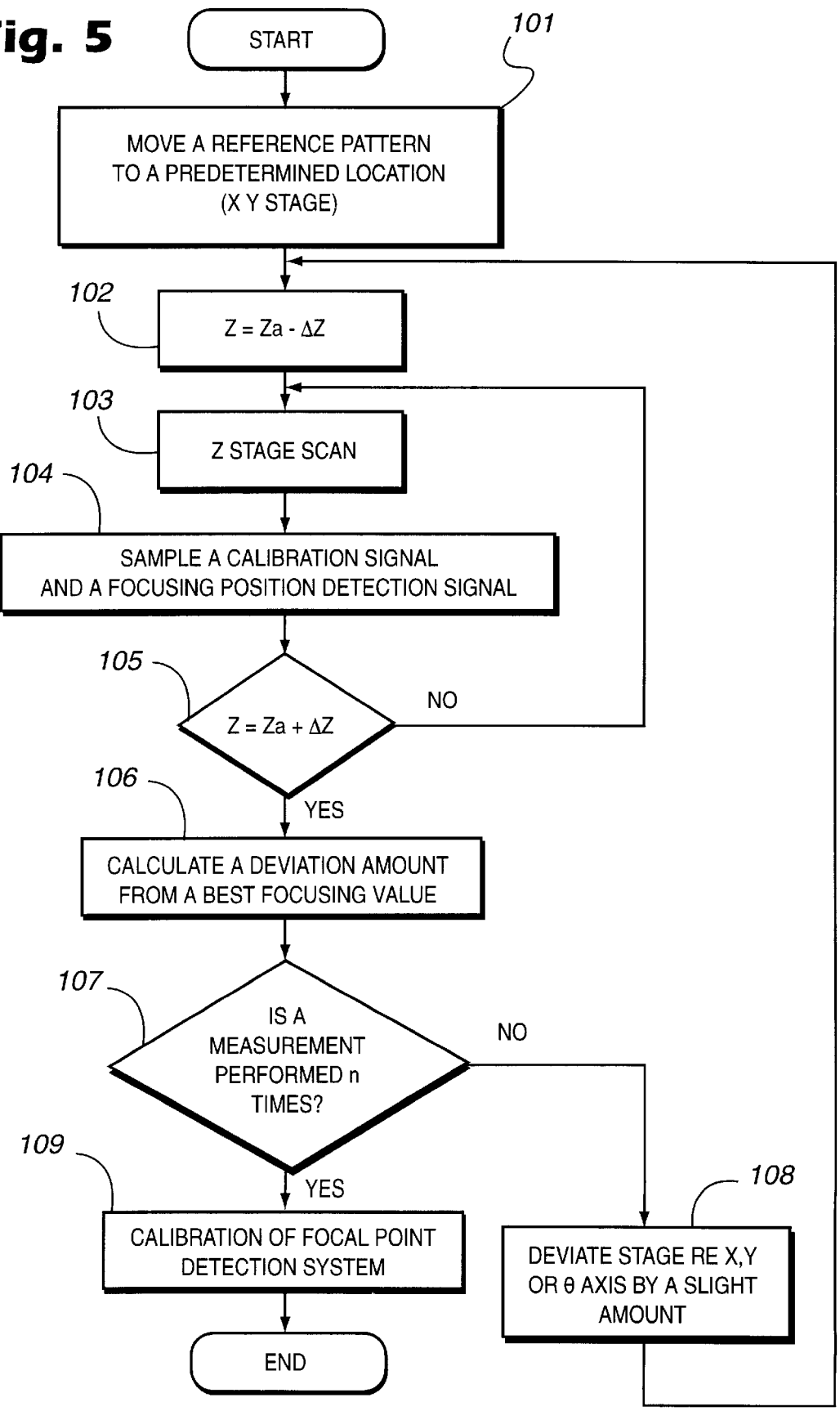
FIG. 5 is a flowchart showing a control algorithm of a main controller of the projection exposure apparatus shown in FIG. 1.

First, at Step 101 in FIG. 5, the main controller 44 controls the driving device 21 to drive the X-stage 12 and the Y-stage 16 to move the reference mark plate FM at a desired measuring location in the image field of the projection optical system PL. At Step 102, the main controller 44 moves the substrate table 18 downwardly via the driving device 21 so that the Z-axis coordinate of the substrate table 18 varies from $Z_B$, which is a coordinate of the present focusing position, by $\Delta Z$. The interval $\Delta Z$ is selected so as to satisfy $\Delta Z > Z_{MAX}$ where a possible maximum absolute value of variation of the imaging plane of the projection optical system PL in the Z direction is $Z_{MAX}$.

At Step 103, the main controller 44 performs scanning of the Z-axis coordinate of the substrate table 18 upwardly from $(Z_B - \Delta Z)$ with a substantially constant rate via the driving device 21 and the Z$\theta$ driving section (not shown). When this scanning starts, the main controller 44 samples the calibration signal KS and the focusing position detection signal FS at the same time in synchronization with a predetermined sampling pulse and writes the sampled values in an internal memory (Step 104). Then, at Step 105, the main controller 44 judges whether the Z-axis coordinate of the substrate table 18 reaches $(Z_B + \Delta Z)$. If the Z-axis coordinate has not reached $(Z_B + \Delta Z)$, the operation goes back to Step 103 and continues scanning in the Z direction. When the Z-axis coordinate reaches $(Z_B + \Delta Z)$ at Step 105, the operation goes to Step 106.

Figure 6A:
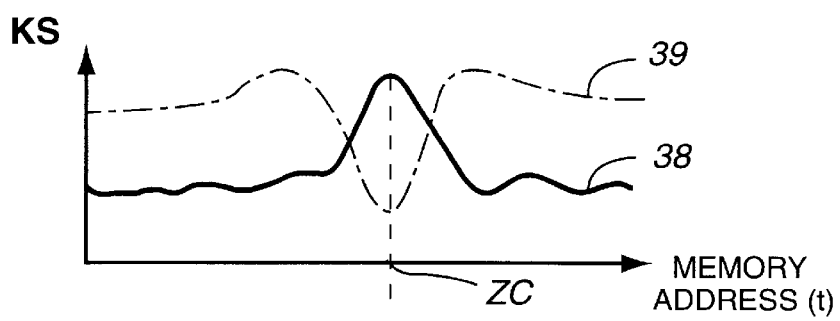
FIGS. 6A and 6B show signals stored in an internal memory of the main controller during the calibration, where
Figure 6B:
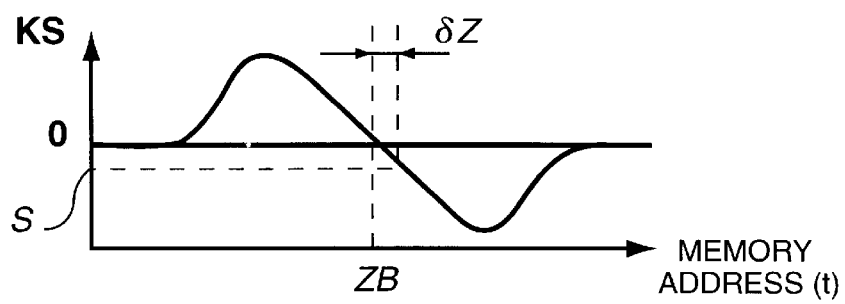

At Steps 102 to 105 described above, for example, the calibration signal KS as shown by a solid curve 38 in FIG. 6A is stored in a series of address areas of the first memory region of the internal memory of the main controller 44, while the focusing position detection signal FS, which is a sigmoid curve having the center at zero, as shown in FIG. 6B, is stored in a series of address areas of the second memory region of the internal memory. The horizontal axis in FIGS. 6A and 6B indicates address. In the present embodiment, since the sampling pulses form a pulse series that becomes a high level "1" every constant unit time period, the address can be represented by time t. Moreover, since the substrate table 18 goes up with a substantially constant rate, an approximate value of the Z-axis coordinate of the substrate table 18 can be obtained by subjecting the time t (or the address value) to linear transformation.

Returning to FIG. 5, at Step 106, the main controller 44 calculates a deviation amount $\delta Z$ between a Z-axis coordinate of an actual focusing position obtained from the calibration signal KS or a position in the vicinity thereof and a Z-axis coordinate of the pseudo-focusing position, which can be obtained from the focusing position detection signal FS.

For example, in the example shown in FIGS. 6A and 6B, the address at which the calibration signal KS becomes maximum corresponds to the actual focusing position $Z_C$, and the address at which the focusing position detection signal FS becomes zero in the sigmoid characteristics corresponds to the previous focusing position $Z_B$, which was set in the previous calibration. In addition, in a case where the grating marks formed on the reference mark plate FM are phase type gratings, the calibration signal KS becomes minimum at the actual focusing position $Z_C$, as shown by a dot curve 39 in FIG. 6A. Thus, in any cases, the deviation amount $\delta Z$ of the Z-axis coordinate can be obtained by performing predetermined linear transformation with respect to deviation address amount obtained by subtracting the address of a zero-cross point of the focusing position detection signal FS from the address of a concave or convex peak of the calibration signal KS.

In this case, as shown at Step 107 in FIG. 5, measuring accuracy can be improved by repeating the operations at Steps 102 to 106 n times (where n is integer equal to or larger than 2). Moreover, as shown at Step 108, after each calculation of the deviation amount is completed, the X-stage 12, the Y-stage 16 and the Z$\theta$ driving section (not shown) are operated via the driving device 21 so as to move a position of the reference mark plate FM in a plane perpendicular to the optical axis of the projection optical system PL by a slight amount. Since this also deviates a position of the pattern region PA of the reticle R onto which the diffraction grating marks 28A to 28D of the reference mark plate FM are projected by a slight amount, the effect of the pattern of the pattern region PA is removed. Therefore, reduction of the measuring accuracy can be prevented.

It should be noted that an operation sequence in which the operation goes back to Step 102 immediately when it is judged that the measurement has not performed n times at Step 107 may be employed.

At Step 109, the main controller 44 stores an averaged deviation amount <$\delta Z$> obtained by averaging the deviation amount $\delta Z$ between the Z-axis coordinate of the actual focusing position or a point in the vicinity thereof and the Z-axis coordinate of the pseudo-focusing position obtained from the focusing position detection signal FS, in the internal memory. Then, the main controller 44 performs the offset adjustment, wherein a value ($Z_B$+<$\delta Z$>) obtained by adding <$\delta Z$> to the Z-axis coordinate value $Z_B$ determined by the previous calibration is determined as a Z-axis coordinate of a new focusing position, so that the focusing position detection signal FS becomes a predetermined pseudo-focusing level at the new focusing position.

In the second focal point detection system 30 of the present embodiment, the absolute focusing position (the optimum imaging plane Fo) can be measured at an arbitrary location in the image field as long as the reticle R is set on the object-side of the projection optical system PL, as described above. Thus, those skilled in the art would understand that curvature of field of the projection optical system PL can be measured by performing the operations at Steps 102 to 106 for each measuring point using the second focal point detection system 30 and the focal point detection system (40, 42) without any detailed explanation.

Accordingly, in the present embodiment, a memory 96 stores the data on the curvature of field of the projection optical system PL measured using the focal point detection system (40, 42) and the second focal point detection system 30 while moving the substrate table 18 in the X-Y plane, so that the data on the curvature of field corresponds to the X and Y coordinates of the substrate table 18. Specific usage of the data stored in the memory 96 will be described in detail later.

An operation of the projection exposure apparatus 10 of the present embodiment having the above-described structure when exposure is performed by using the whole exposable region (SA) of the projection optical system PL as an exposure region will be explained. Here, a case of step and repeat type exposure using a so-called enhanced global alignment (hereinafter, simply referred to as "EGA") method as disclosed in, for example, Japanese Laid-Open Patent Publication No. 61-44429, will be described. In the EGA method, all of shot array coordinates on the wafer are obtained by a statistical operation using the least-squares method based on measured values of alignment mark positions on the wafer W and designed values of the shot array, and the respective shot areas are positioned on the exposure locations based on the shot array coordinates.

In this case, it is assumed that a reticle alignment by a reticle microscope (not shown) has already been performed.

First, the main controller 44 controls the driving device to move the substrate table 18 by driving the Y-stage 16 and the X-stage 12 so that the reference mark plate FM is positioned below the projection optical system PL, and stores an output from the laser interferometer 31 obtained at that time in the internal memory (not shown). Then, the main controller 44 controls the driving device 21 to drive one or both of the X-stage 12 and the Y-stage 16 to move the substrate table 18 so that the reference mark plate FM is located below an alignment sensor (not shown) and stores an output from the alignment sensor and the output of the laser interferometer 31 obtained at that time in the internal memory. In this way, a base line measurement is performed. Since the sequence of the base line measurement in the present embodiment is similar to that of a conventional projection exposure apparatus, the detailed description thereof is omitted.

The main controller 44 then moves the substrate table 18 via the driving device 21 so that an alignment mark on the wafer W is located below the alignment sensor (not shown) and detects an alignment mark position based on the output of the alignment sensor and the output of the laser interferometer 31. Thus, a measurement of the position of the alignment mark juxtaposed with a predetermined sample shot is performed and all of the shot array coordinates on the wafer W are obtained by a so-called EGA operation using this measurement result. The detailed description of the EGA operation is omitted here, since the EGA operation is disclosed in detail in, for example, Japanese Laid-Open Patent Publication No. 61-44429.

The main controller 44 next controls the position of the substrate table 18 based on the detection result of the alignment mark position and the result of the aforementioned base line measurement so that the respective shot areas (each of which corresponds to a semiconductor chip in a case where one chip area is exposed by one shot) are positioned below the projection optical system PL one by one. At the same time, the main controller 44 controls opening/closing of a shutter (not shown) in the illumination system while performing the automatic focusing operation based on the focusing position detection signal FS from the signal processor 91, thereby repeating stepping of the substrate table 18 and the exposure to the substrate table 18. In this way, successive superimposed exposure of the respective shot areas on the wafer W is performed using a step and repeat technique.

When blind setting information (masking information) is input from a main computer (not shown), the main controller 44 sets the shape (including the size) of the exposure region on the wafer W by driving the movable blinds 45A and 45B via the blind driving sections 43A and 43B in response to the blind setting information. In addition, prior to positioning each shot area below the projection optical system PL, the main controller 44 drives one or both of the X-stage 12 and the Y-stage 16 via the driving device 21 to move the substrate table 18 to a location at which the center portion of the exposure region set by the movable blinds 45A and 45B based on the blind setting information coincides with the detection center of the focal point detection system (40, 42), and the controller 44 thereafter performs the focusing operation by adjusting the Z-position of the substrate table 18 via the driving device 21 based on the focusing position detection signal FS from the signal processor 91. Then, while keeping the position of the surface of the wafer W in the optical axis direction, the substrate table 18 is moved to reach the exposure location by driving one or both of the X-stage 12 and the Y-stage 16 via the driving device 21 so that the present shot area is positioned at the exposure location.

In this way, for the exposure region set by the movable blinds 45A and 45B, exposure can also be performed in the in-focus state, and resolution and exposure accuracy can be improved.

Figure 7:
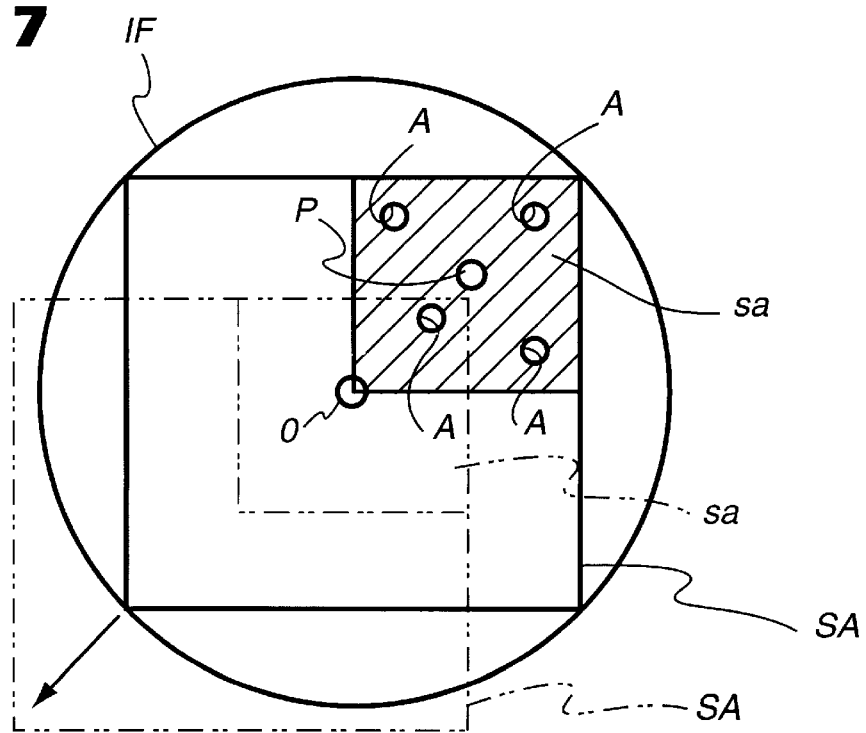
FIG. 7 is a diagram for explaining an operation when performing the focusing operation of an exposure region set by movable blinds as shown in FIG. 1.

FIG. 7 illustrates a case of exposing an upper-right quarter region (hatched portion) sa of the exposable region SA shown by a solid line. According to the above-described method, first, the exposable region SA is moved from a location shown by the solid line to a location shown by the two-dot chain line (an imaginary line), and the center P of the exposure region sa is positioned at the center O of the exposure field IF where the focusing operation is performed. After the focusing operation, the exposable region SA is moved again to the location shown by the solid line while keeping the Z-position of the wafer W, and exposure (printing) is performed. In this case, as is apparent from FIG. 7, the focusing operation at the center P of the exposure region sa set by the movable blinds 45A and 45B is performed at the center O of the exposable region SA of the projection optical system PL, and exposure is performed with respect to the exposure region sa set by the movable blinds 45A and 45B. Therefore, an end portion of the projection optical system PL is used during printing. Since curvature of field of the projection optical system PL is not insignificant, the focal point detection system (40, 42) is adjusted to match with the best focusing plane of the projection optical system PL on which the detection point of the focal point detection system (40, 42) is located. Thus, focusing deviation may occur due to the effect of the curvature of field. Accordingly, it is desirable that the main controller 44 correct the focusing deviation due to the curvature of field in the exposure region sa on the wafer W set by the movable blinds 45A and 45B.

Next, a focusing operation considering the correction of the focusing deviation due to the curvature of field will be explained. Two techniques for such a focusing operation will be described.

(1) The first technique uses the data on the curvature of field, which has been previously measured using the focal point detection system (40, 42) and the second focal point detection system 30 and stored in the memory 96.

When the blind setting information is input from the main computer (not shown), the main controller 44 sets the shape (including the size) of the exposure region on the wafer W by driving the movable blinds 45A and 45B via the blind driving sections 43A and 43B in response to the blind setting information. In addition, prior to positioning the respective shot areas on the wafer W below the projection optical system PL, the main controller 44 calculates a difference between a focusing position in the exposure region sa of the projection optical system PL and a focusing position in the vicinity of the optical axis of the projection optical system PL (which corresponds to a focusing position at the detection center of the focal point detection system (40, 42)), based on the data on the curvature of field corresponding to the center of the exposure region sa, which is stored in the memory 96 based on the blind setting information. The main controller 44 temporarily stores the calculation results in the internal memory.

Next, the main controller 44 drives one or both of the X-stage 12 and the Y-stage 16 via the driving device 21 to move the substrate table 18, so that the center of the exposure region sa set by the movable blinds 45A and 45B based on the blind setting information coincides with the detection center of the focal point detection system (40, 42). At that location, the main controller 44 performs the focusing operation by adjusting the Z-position of the substrate table 18 via the driving device 21 based on the focusing position detection signal FS from the signal processor 91. The main controller 44 sets an offset with respect to the detection signal FS of the focal point detection system using the difference that has been previously calculated and performs the focusing operation.

Then, the substrate table 18 is moved to the exposure location by driving one or both of the X-stage 12 and the Y-stage 16 via the driving device 21 so that the exposure region sa is positioned at the exposure location, while maintaining the position of the surface of the wafer W in the optical axis direction, and thereafter exposure is performed.

In this case, when the data on the curvature of field at or in the vicinity of the center of the exposure region sa is not stored in the memory 96, the focusing operation may be performed using interpolated data on the curvature of field and the blind setting information at the center of the exposure region sa in a similar manner to the above using a quadratic function to a sixth order function.

In this way, satisfactory printing can be always performed at any location in the exposable region of the projection optical system PL.

(2) The second technique is a technique where the memory 96 is not provided or where appropriate data on the curvature of field is not stored in the memory 96, and the system performs a real-time measurement of the data on the curvature of field of the projection optical system PL during exposure.

Hereinafter, with reference to a flowchart shown in FIG. 8, an operation during exposure in accordance with the second technique will be described. Here, a case where step and repeat type exposure is performed by the so-called EGA method described before will be explained.

Figure 8:
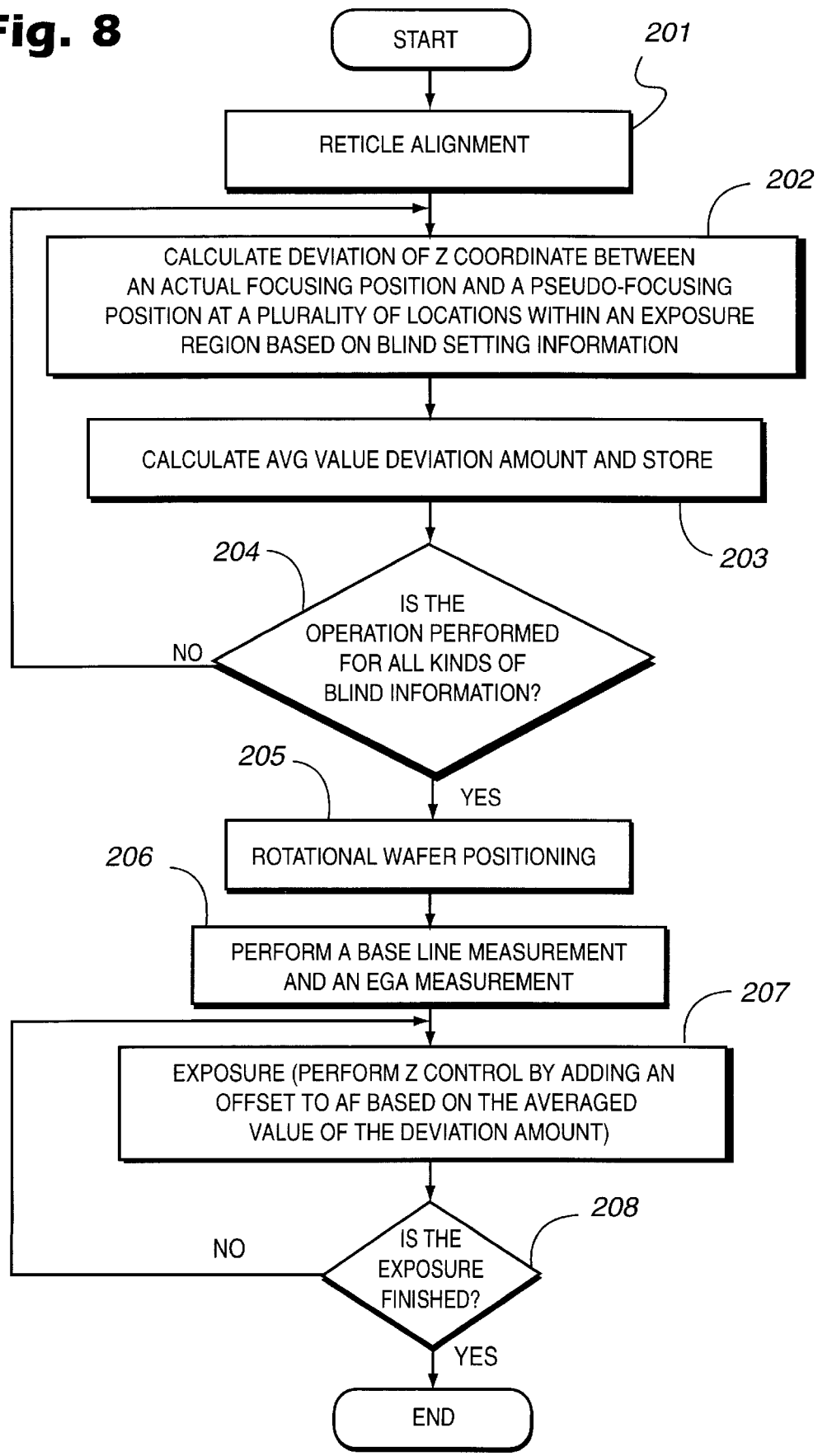
FIG. 8 is a flowchart showing an exposure sequence, including a method in which a real-time measurement of data on curvature of field of the projection optical system PL is performed during exposure.

At Step 201 in FIG. 8, the main controller 44 positions the reticle R so that the reticle center coincides with the optical axis of the projection optical system PL, using a reticle microscope (not shown), a reference mark (not shown—a cross-shaped mark is typically used as the reference mark) on the reference mark plate FM, and a reticle mark (not shown—a double-cross-shaped mark, for example) drawn on the reticle R, thereby performing reticle alignment. The sequence of the reticle alignment in the present embodiment is similar to that by a conventional projection exposure apparatus, and therefore, a detailed description thereof is omitted.

At Step 202, based on the blind setting information from the main computer (not shown), the main controller 44 obtains deviation of the Z-axis coordinate between the actual focusing position and the pseudo-focusing position at a plurality of locations within the exposure region set in accordance with the blind setting information (which are at least three locations including the center of the exposure region, and preferably five locations including the center and four locations at four corners having the same image height, and more preferably the center and 9 to 13 locations having image heights that increase by a predetermined interval).

More specifically, operations similar to those at Steps 101 to 107 in the flowchart shown in FIG. 5 are performed while moving the position of the substrate table 18 to the respective measuring locations, and deviation between the Z-axis coordinate of the actual focusing position or a point in the vicinity of the actual focusing position obtained from the calibration signal KS and the Z-axis coordinate of the pseudo-focusing position obtained from the focusing position detection signal FS (i.e., a deviation amount from the best focusing value) is obtained at each measuring location. The deviation amount at each measuring location corresponds to the data on the curvature of field.

In this case, as shown in FIG. 7, the measuring locations may be set within the exposable region SA in advance, and the deviation of the Z-axis coordinate between the actual focusing position and the pseudo-focusing position at measuring locations A existing in the region sa set by the movable blinds 45A and 45B (which are shown by black circles in FIG. 7) may be obtained.

At Step 203, the main controller 44 calculates an averaged value of the deviation amounts measured at Step 202 and stores the averaged value in the internal memory. By using the averaged value of the deviation amounts for setting an offset with respect to the detection signal FS of the focal point detection system (40, 42) and by performing the focusing operation, the automatic focusing operation, which regards a position having the average height in the exposure region sa set by the movable blinds 45A and 45B as the focusing plane, can be obtained.

At Step 204, the main controller 44 judges whether the operations at Steps 202 and 203 are performed with respect to all kinds of blind setting information that is registered for the exposure process. If the judgment is no, the main controller 44 repeats the operations at Steps 202 and 203. On the other hand, if the judgment is yes, the main controller 44 performs a rotational alignment of the reticle R with the wafer W while monitoring the output of the interferometer 31 at Step 205, and the controller 44 performs the base line measurement and an EGA measurement (a measurement of a position of an alignment mark juxtaposed with the sample shot and a statistical operation using it) at Step 206, thereby obtaining all of the shot array coordinates on the wafer W using the measurement results.

At Steps 207 and 208, exposure is performed while positioning the respective shot areas on the wafer W at the exposure location set by the movable blinds 45A and 45B one by one. When exposure for all of the shot areas to be exposed is completed, the series of processes is finished.

At Step 207, the main controller 44 sets the shape (including the size) of the exposure region on the wafer W by driving the movable blinds 45A and 45B via the blind driving sections 43A and 43B for every change of the blind setting information, which is predetermined corresponding to the respective shot areas, and performs exposure while positioning the respective shot areas at the exposure locations based on the shot array coordinates obtained at Step 206 and the blind setting information. At this time, prior to positioning each shot area at the exposure locations, the main controller 44 positions the wafer W via the driving device 21 so that the center of the exposure region sa set by the movable blinds 45A and 45B coincides with the detection center of the focal point detection system (40, 42) based on the blind setting information, and the controller 44 then performs the focusing operation by setting an offset in the detection signal FS of the focal point detection system (40, 42) by an amount corresponding to the deviation amount calculated at Step 203. Thereafter, the main controller 44 moves the substrate table 18 to reach the exposure location by driving one or both of the X-stage 12 and the Y-stage 16 via the driving device 21 so that the exposure region sa is positioned at the exposure location, while maintaining the position of the surface of the wafer W in the optical axis direction, and the controller 44 performs the exposure.

When the operation at Step 202 is not performed at or in the vicinity of the center of the exposure region sa, the data on the curvature of field, which is actually detected at a position close to the center of the exposure region sa, may be interpolated by using a quadratic function to the sixth order function, and the focusing operation may be performed at the center of the exposure region sa based on the interpolated data on the curvature of field and the blind setting information in a manner similar to the above.

In this way, satisfactory printing can be performed at any location within the exposable region SA of the projection optical system PL. Moreover, in this second technique, the operations at Steps 202 and 203 are performed with respect to all kinds of blind setting information registered for the exposure process. Therefore, the second technique is suitable for, for example, a case where a plurality types of circuit patterns are formed on the reticle R and the patterns are transferred on a plurality of shot areas, respectively.

As is apparent from the above explanation, in the present embodiment, the driving device 21, the X-stage 12, the Y-stage 16, the movable mirror 27, the interferometer 31 and the main controller 44 constitute a position control system that controls positions of the substrate table 18 in three axial directions X, Y and Z. Moreover, a stage control system, a curvature of field measuring section, an operator, and a controller are obtained by functions of the main controller 44.

Although a case of performing the step and repeat exposure by the so-called EGA method is explained in the above embodiment, the present invention should not be limited thereto. The present invention can also be applied to a case of performing the step and repeat type exposure with a die-by-die method or the like.

As described above, according the present invention, a projection exposure method that can perform high-accuracy exposure while performing an appropriate focusing operation, irrespective of the change of the shape of the exposure region, is provided.

Moreover, according to the present invention, a novel projection exposure apparatus that can perform high-accuracy exposure while performing an appropriate focusing operation, irrespective of the change of the shape of the exposure region, is provided.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A projection exposure method for illuminating a mask having a pattern formed thereon with exposure light so as to expose an image of the pattern formed on the mask onto a photosensitive substrate through a projection optical system, the method comprising:

providing a variable field stop that is capable of variably setting an exposure region on the photosensitive substrate;

performing a focusing operation prior to exposure for aligning a center of the exposure region on the photosensitive substrate with an imaging position of the projection optical system based on setting information of the variable field stop; and exposing the pattern onto the exposure region wherein a position on the substrate where exposure of the pattern onto the exposure region is performed is different from a position on the substrate where the focusing operation for the exposure region is performed.

2. A projection exposure method according to claim 1, further comprising, bringing a surface of the photosensitive substrate at the center of the exposure region into a focal plane of the projection optical system at a location different from a predetermined exposure location based on the setting information of the variable field stop, and positioning the photosensitive substrate at the exposure location while maintaining a position in an optical axis direction of the photosensitive substrate.

3. A projection exposure method according to claim 2, further comprising determining the focal plane of the projection optical system in accordance with a calibration signal and a focus position detection signal.

4. A projection exposure method according to claim 3, wherein the calibration signal is determined by emitting an illumination light along a calibration light path through a reference mark plate, through the projection optical system to a pattern surface on the mask, reflecting the illumination light from the pattern surface on the mask along the calibration light path to the reference mark plate, and sensing an amount illumination light reflected through the reference mark plate.

5. A projection exposure method according to claim 4, wherein the focus position detection signal is determined by performing focal point detection using oblique incident light on the photosensitive substrate with an illumination optical system and a light receiving optical system.

6. A projection exposure method according to claim 3, further comprising storing the calibration signal and the focus position detection signal in a series of address areas in a first memory region and a second memory region, respectively, while controlling the position of the photosensitive substrate in the optical axis direction.

7. A projection exposure method according to claim 6, wherein the step of determining the focal plane of the projection optical system comprises determining a deviation amount of a Z-axis coordinate in the optical axis direction by performing predetermined linear transformation with respect to deviation address amount obtained by subtracting the address of a zero-cross point of the focus position detection signal from the address of a concave or convex peak of the calibration signal.

8. A projection exposure method according to claim 7, wherein the step of determining the deviation amount is repeated n times, and wherein the focal plane of the projection optical system is determined in accordance with an average deviation amount.

9. A projection exposure method according to claim 1, wherein the focusing operation is performed at a position where the center of the exposure region is substantially aligned with an optical axis of the projection optical system.

10. A projection exposure method according to claim 1, wherein exposure is performed at a position where the center of the exposure region is offset from an optical axis of the projection optical system.

11. A projection exposure method for illuminating a mask having a pattern formed thereon with exposure light so as to expose an image of the pattern formed on the mask onto a photosensitive substrate through a projection optical system, the method comprising:

(a) measuring curvature of field of the projection optical system;

(b) performing a focusing operation at a center of an exposure region on the photosensitive substrate set by a variable field stop based on data on the curvature of field and setting information of the variable field stop; and (c) exposing the pattern onto the exposure region in a position on the substrate different from a position on the substrate where the focusing operation for the exposure region is performed.

12. A projection exposure method according to claim 11, wherein steps (a) and (b) are performed during exposure or prior to starting exposure.

13. A projection exposure method according to claim 12, wherein step (a) is performed with respect to at least three locations on the photosensitive substrate.

14. A projection exposure method according to claim 13, further comprising the step of interpolating the data on the curvature of field obtained in step (a) by using a quadratic function to a sixth-order function, wherein step (b) is performed based on the interpolated data on the curvature of field and the setting information of the variable field stop.

15. A projection exposure method according to claim 11, wherein step (a) is performed with respect to at least three locations on the photosensitive substrate.

16. A projection exposure method according to claim 15, further comprising the step of interpolating the data on the curvature of field obtained in step (a) by using a quadratic function to a sixth-order function, wherein step (b) is performed based on the interpolated data on the curvature of field and the setting information of the variable field stop.

17. A projection exposure method according to claim 11, wherein step (b) is performed based on a focus position detecting signal.

18. A projection exposure method according to claim 17, wherein the focus position detection signal is determined by performing focal point detection using oblique incident light on the photosensitive substrate with an illumination optical system and a light receiving optical system.

19. A projection exposure method according to claim 11, further comprising, after step (b), the step of positioning the photosensitive substrate so that the exposure region is positioned at a predetermined exposure location while maintaining the position of the photosensitive substrate in an optical axis direction.

20. A projection exposure method according to claim 11, wherein the focusing operation is performed at a position where the center of the exposure region is substantially aligned with an optical axis of the projection optical system.

21. A projection exposure method according to claim 11, wherein exposure is performed at a position where the center of the exposure region is offset from an optical axis of the projection optical system.

22. A projection exposure apparatus for illuminating a mask having a pattern formed thereon with exposure light so as to expose an image of the pattern formed on the mask onto a photosensitive substrate through a projection optical system, the apparatus comprising:
- a specimen support movable in at least three axial directions, the specimen support supporting the photosensitive substrate, wherein the at least three axial directions include an optical axis direction of the projection optical system and mutually orthogonal two axial directions in a plane perpendicular to the optical axis direction;
- a position control system operatively coupled with the specimen support, the position control system controlling a position of the specimen support in the at least three axial directions;
- a focal point detection system that detects a position in the optical axis direction in the vicinity of the optical axis;
- a variable field stop disposed in an exposure region optical path including the photosensitive substrate, the variable field stop setting an exposure region on the photosensitive substrate where the image of the pattern is projected; and
- a controller communicating with the variable field stop, the focal point detection system and the position control system, the controller discriminating the exposure region on the photosensitive substrate based on setting information of the variable field stop, and the controller moving the exposure region on the photosensitive substrate to a predetermined exposure location after an approximate center of the exposure region is brought onto a focal point of the projection optical system using the position control system and the focal point detection system, wherein a position on the substrate where exposure of the pattern onto the exposure region is performed is different from a position on the substrate where the discriminating of the exposure region is performed.

23. A projection exposure apparatus for illuminating a mask having a pattern formed thereon with exposure light so as to expose an image of the pattern formed on the mask onto a photosensitive substrate through a projection optical system, the apparatus comprising:
- a specimen support movable in at least three axial directions, the specimen support supporting the photosensitive substrate, wherein the at least three axial directions include an optical axis direction of the projection optical system and mutually orthogonal two axial directions in a plane perpendicular to the optical axis direction;
- a position control system operatively coupled with the specimen support, the position control system controlling a position of the specimen support in the at least three axial directions;
- a focal point detection system that detects a position in the optical axis direction in the vicinity of the optical axis;
- a variable field stop disposed in an exposure region optical path including the photosensitive substrate, the variable field stop setting an exposure region on the photosensitive substrate where the image of the pattern is projected;
- a memory storing data on curvature of field of the projection optical system measured with respect to at least three locations on the photosensitive substrate;
- an operator communicating with the memory, the operator calculating a difference between a focusing position in the exposure region of the projection optical system and a focusing position in the vicinity of the optical axis of the projection optical system based on the data on the curvature of field; and
- a controller communicating with the operator, the memory, the variable field stop, the focal point detection system and the position control system, the controller positioning the photosensitive substrate via the position control system so that an approximate center of the exposure region coincides with a detection center of the focal point detection system based on setting information of the variable field stop, wherein the controller performs a focusing operation of the exposure region in accordance with the difference calculated by the operator, and wherein a position on the substrate where exposure of the pattern onto the exposure region is performed is different from a position on the substrate where the focusing operation for the exposure region is performed.

24. A projection exposure apparatus for illuminating a mask having a pattern formed thereon with exposure light so as to expose an image of the pattern formed on the mask onto a photosensitive substrate through a projection optical system, the apparatus comprising:
- a substrate stage movable two-dimensionally in a reference plane;
- a specimen support mounted on the substrate stage, the specimen support supporting the photosensitive substrate and being movable in an optical axis direction of the projection optical system;
- a driving system operatively coupled with the substrate stage and the specimen support, the driving system driving the substrate stage and the specimen support in respective moving directions;
- a position measuring section operatively communicating with the specimen support for measuring a position in the reference plane of the specimen support;
- a stage control system that controls a position of the substrate stage via the driving system, the stage control system monitoring an output of the position measuring section;
- a first focal point detection system that detects a position in the optical axis direction in the vicinity of the optical axis;
- a variable field stop for setting an exposure region on the photosensitive substrate where the image of the pattern is projected;
- a second focal point detection system disposed in the exposure region optical path, the second focal point detection system discriminating an optimum imaging plane of the projection optical system;
- a curvature of field measuring section that measures data on curvature of field of the projection optical system for a plurality of locations within the exposure region using the second focal point detection system based on setting information of the variable field stop;
- an operator communicating with the curvature of field measuring section, the operator calculating a difference between a focusing position in the exposure region and a focusing position of the projection optical system in the vicinity of a detection center of the focal point detection system based on the data on curvature of field; and
- a controller communicating with the operator, the curvature of field measuring section, the second focal point detection system, the variable field stop, the first focal point detection system, the stage control system, the position measuring section and the driving system, the controller positioning the photosensitive substrate via the stage control system so that a center of the exposure region set by the variable field stop coincides with the detection center of the first focal point detection system, based on the setting information of the variable field stop, wherein the controller adjusts the first focal point detection system using the difference to perform a focusing operation.

25. A projection exposure apparatus for illuminating a mask having a pattern formed thereon with exposure light so as to expose an image of the pattern formed on the mask onto a photosensitive substrate through a projection optical system, the apparatus comprising:

a variable field stop disposed in an exposure region optical path including the photosensitive substrate, the variable field stop setting an exposure region on the photosensitive substrate where the image of the pattern is projected;

a focal point detection system that detects a focus position of the photosensitive substrate in the optical axis direction; and a controller communicating with the variable field stop and the focal point detection system, the controller discriminating the exposure region on the photosensitive substrate based on setting information of the variable field stop and moving the exposure region on the photosensitive substrate to a predetermined exposure location after an approximate center of the exposure region is brought onto the focus position using the focal point detection system.

26. A projection exposure apparatus according to claim 25, further comprising a memory storing data on curvature of field of the projection optical system, said controller communicating with said memory and performing a focusing operation in accordance with the data on curvature of field.

27. A projection exposure apparatus according to claim 25, further comprising a second focal point detection system disposed in the exposure region optical path, the second focal point detection system discriminating an optimum imaging plane of the projection optical system and measuring data on curvature of field for a plurality of locations within the exposure region based on the setting information of the variable field stop.

28. A projection exposure apparatus according to claim 27, wherein said controller comprises structure that interpolates the data on the curvature of field using a quadratic function to a sixth-order function for locations within the exposure region other than the plurality of locations.

* * * * *